(12) United States Patent
Maes et al.

(10) Patent No.: US 6,992,289 B2
(45) Date of Patent: Jan. 31, 2006

(54) METHOD FOR PERFORMING FOCUSING IN A PARTICLE-OPTICAL DEVICE WITH THE AID OF ASTIGMATISM IN THE PARTICLE BEAM

(75) Inventors: Willem Hendrik Maes, Lommel (BE); Robertus Johannes Michael Vucht, Best (NL); Hendrikus Petrus Maria Sterken, Deurne (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 10/928,573

(22) Filed: Aug. 27, 2004

(65) Prior Publication Data

US 2005/0045831 A1 Mar. 3, 2005

(30) Foreign Application Priority Data

Aug. 29, 2003 (NL) .............................. 1024192

(51) Int. Cl.
*H01J 29/56* (2006.01)
*H01J 29/58* (2006.01)

(52) U.S. Cl. ...................... 250/307; 250/306; 250/310; 250/398; 250/396 R; 250/491.1; 250/492.1; 250/492.2

(58) Field of Classification Search ................. 250/307, 250/306, 310, 396 R, 398, 491.1, 492.1, 250/492.2
See application file for complete search history.

(56) References Cited

U.S. PATENT DOCUMENTS 5,144,129 A 9/1992 Kobayashi et al.
6,825,480 B1 * 11/2004 Watanabe et al. ........ 250/491.1
2003/0006371 A1 * 1/2003 Watanabe et al. ........... 250/310
2005/0035290 A1 * 2/2005 Saitoh ........................ 250/307

OTHER PUBLICATIONS

K.H. Ong, J C.H. Phang and J.T.L. Thong, "A Robust Focusing and Astigmatism Correction Method for the Scanning Electron Microscope," Scanning, vol. 19, (1997) pp. 553–563.
Ogasawara Munehiro et al, "Automatic Focusing and Astigmatism Correction Method Based on Fourier Transform of Scanning Electron Microscope Images,"Appl. Phys., Publication Board, Japanese Journal of Applied Physics, vol. 38 (1999) pp 957–960.

* cited by examiner

*Primary Examiner*—Nikita Wells
(74) *Attorney, Agent, or Firm*—Michael O. Scheinberg

(57) ABSTRACT

Method for performing focusing in a particle-optical device with the aid of astigmatism in the particle beam.

In a particle-optical device such as an electron microscope it is advantageous to perform the process of focusing automatically. In accordance with the invention, the electron beam which is to be focused is deliberately made astigmatic to a certain degree. With this astigmatic beam, two images of a specimen are made at two different settings of the objective, after which in each of the images the direction of the astigmatic smearing is determined—for example, with the aid of a two-dimensional Fourier transform (FFT). The directions of the astigmatic smearing are perpendicular to each other if, in the transition from a first setting of the objective to a second one, the point of optimum focus is passed. Through a process of interpolation (which process may be iterative) between these two settings, the point of optimum focus can now be determined. Possible anisotropy in the specimen itself can be eliminated by making two images at both of the settings of the objective and by subtracting the FFTs thereof from each other.

19 Claims, 5 Drawing Sheets

METHOD FOR PERFORMING FOCUSING IN A PARTICLE-OPTICAL DEVICE WITH THE AID OF ASTIGMATISM IN THE PARTICLE BEAM

TECHNICAL FIELD OF THE INVENTION

The invention pertains to a method for focusing a beam of electrically-charged particles in a particle-optical device with an imaging objective lens.

BACKGROUND OF THE INVENTION

Such a method is known from a publication in SCANNING, Vol. 19, (1997) pages 553–563, entitled "A Robust Focusing and Astigmatism Correction Method for the Scanning Electron Microscope". This article describes a method for focusing a beam of electrically-charged particles, whereby the electrically-charged particles are electrons. The particle-optical device with an imaging objective lens in which this method is implemented is a scanning electron microscope (SEM). In accordance with the method therein described, an image of a specimen in the particle-optical device is made at two differing settings of the imaging objective lens; subsequently, for each of the images, the spectral-energy content is determined in dependence upon the spatial frequency occurring in that image. This last-mentioned process is performed using a so-called Fast Fourier Transform (FFT).

Prior to making the two images, the nominal refractive power of the objective lens is first determined; that is to say the refractive power value for which the electron beam is approximately focused on the specimen. A deviation from this nominal setting is then applied, such that a setting of "over-focus" arises; additionally a deviation from the nominal setting is applied such that a setting of "under-focus" arises. The two images which are made at the two different settings of the imaging objective lens therefore consist of an "over-focus" image and an "under-focus" image. In order to automatically focus the electron beam, the total spectral energy content of both images is determined, as is the difference between the spectral energy content of the "over-focus" image and the "under-focus" image. The ratio R of this difference to the total spectral energy content gives a measure of the defocusing of the electron beam. If R is positive, then the "over-focus" image is sharper than the "under-focus" image and the focal length must therefore be shortened; if R is negative. the "under-focus" image is sharper than the "over-focus" image and the focal length must therefore be lengthened.

Along with this method for focusing the electron beam, a method is described for minimizing the astigmatism of the electron beam. In this last mentioned method, the spectral energy content of a number of sectors of the image is determined for each of the two images, and, on the basis of the difference between the respective spectral energy contents, a decision is made as regards in which direction the astigmatism must be increased or decreased in order to arrive at a beam which is virtually free of astigmatism.

Both the method for focusing the electron beam and the method for minimizing the astigmatism of the electron beam are described in particular in the aforementioned article on page 558 from equation (2) onwards to page 559 up to the paragraph entitled "Implementation". It should be clear that, to automatically focus the electron beam, use is only made of the ratio between the spectral energy contents of both images, and not of the degree of astigmatism of the electron beams. In other words, with this known method it is possible to implement the focusing method without the presence of astigmatism in the beam which is to be focused.

SUMMARY OF THE INVENTION

It is an aim of the invention to provide an alternative method for focusing a beam of electrically-charged particles in a particle-optical device with an imaging objective lens. In the most general form of this method according to the invention, the following steps are carried out:

(a). forming, from the aforementioned beam (that is to say the beam of electrically charged particles that is to be focused in the particle-optical device), a first astigmatic beam with an attendant astigmatic direction for a first setting of the objective lens;

(b). making an image, with the first astigmatic beam, of a specimen in the particle-optical device;

(c). determining the direction of the astigmatic smearing (blurring) in the image made in step (b):

(d). providing a different setting to the objective lens:

(e). forming a second astigmatic beam from the aforementioned beam, which second beam has an attendant astigmatic direction for the other setting of the objective lens;

(f). making an image of the specimen with the second astigmatic beam;

(g). determining the direction of the astigmatic smearing in the image made in step (f):

(h). comparing the direction of the astigmatic smearing in the image made in step (b) with that of the image made in step (f).

(i). repeating steps (d) to (h) in the case that the aforementioned directions are equal, and, in the case that the aforementioned directions are not equal, performing an interpolation process between the first setting of the objective lens and the last-obtained setting of the objective lens, so as to determine that setting of the objective lens at which the beam of electrically charged particles attains its optimum focus.

In this method according to the invention, the beam that is to be focused is deliberately made astigmatic and the astigmatism in this beam is used for focusing the beam. Use is thereby made of the insight known per se that the direction of the smearing in the image as caused by the astigmatism changes by 90° in direction when the focus of the beam changes from over-focus to under-focus or vice versa. To that end, a first image of the specimen is made with a known direction of the astigmatism applied to the beam, and the smearing in this image as a result of that astigmatism is determined (steps a to c). Subsequently, a second image of the specimen is made at a different setting of the objective lens—likewise with a known direction of the astigmatism applied to this beam—and the smearing in this second image as a result of that astigmatism is determined (steps d to g). It is convenient if the direction of the astigmatism in the first image is equal to that in the second image, although this is not necessary. It is now assumed that the direction of the astigmatism in the beam in both instances is the same. If, upon comparison of the direction of the astigmatic smearing in the first image with that in the second image it appears that these directions are not equal, then the conclusion must be reached that, upon making the first image, under-focus was set while over-focus was set while making the second image. The optimal focus shall therefore lie somewhere in between these two settings, and the setting whereby that is the case can be determined with the aid of a process of interpolation between both settings of the objective lens. If, upon comparison of the direction of the astigmatic smearing in the first image with that in the second image, it appears that these directions are indeed equal, then the conclusion must be reached that, while making both images, only under-focus or only over-focus was present. A new setting should now be given to the objective lens until the directions of both smearings are unequal, whereupon the aforementioned process of interpolation can be carried out. An advantage of the method according to the invention lies in the fact that, with this method, a zero-crossing is sought (namely, in the interpolation between the first setting of the objective lens and the last-obtained setting of the objective lens, so as to determine that setting of the objective lens whereby the beam of electrically charged particles attains its optimum focus), which, in general, offers a faster convergence of the algorithm to be applied in the method than the usual methods for automatic focusing in a particle-optical device, where the algorithms employed seek a minimum or a maximum. As is known, the course of a curve in the neighborhood of an extremity is relatively flat, while that in the neighborhood of a zero-crossing is much less flat.

In a preferential embodiment of the invention, the determination of the direction of the astigmatic smearing in an image takes place by determining the spectral energy content of a first spectral region of the image in question with a first direction, and of the spectral energy content of a second spectral region of that image with a second direction transverse to the first direction, and by determining at least the sign of the difference between the spectral energy content in the first region and the spectral energy content in the second region. In this embodiment, a sector is chosen (a first spectral region of the image in question with a first direction) in a two-dimensional graphical depiction of the spectral energy content, and the energy content in said sector is determined; this is also done with a sector transverse (preferably perpendicular) thereto (a second spectral region of that image with a second direction transverse to the first direction). For a certain direction of the astigmatic smearing in the image, the one spectral energy content will differ from the other, and, from the sign of this difference, the direction of the smearing can be determined.

In a further embodiment of the invention, the comparison of the direction of the astigmatic smearing in the image made in step (b) with that of the image made in step (f) takes place by comparing the signs of the difference in the spectral energy content of the first region and of the spectral energy content of the second region of each of the images. In this embodiment, the process mentioned in the previous paragraph in applied to each of the two images so as to determine the direction of the astigmatic smearing. From the sign of the difference between these two directions, it can be ascertained if the astigmatic smearings have the same direction or are transverse to each other.

In another preferential embodiment of the invention the following steps are carried out:

(j) for the first setting of the objective lens, a first further astigmatic beam with a known astigmatic direction transverse to the astigmatic direction of the first astigmatic beam is formed and a first image of the specimen is made with the first astigmatic beam and a first further image of the specimen is made with the first further astigmatic beam;

(k) for the second setting of the objective lens, a second further astigmatic beam with a known astigmatic direction transverse to the astigmatic direction of the second astigmatic beam is formed and a second image of the specimen is made with the second astigmatic beam and a second further image of the specimen is made with the second further astigmatic beam;

(l) in the four images thus made, the direction of the astigmatic smearing is determined by determining the spectral energy content of a first spectral region of the image in question with a first direction, and determining the spectral energy content of a second spectral region of that image with a second direction transverse to the first direction, whereby in each image at least the sign of the difference between the spectral energy content of the first region and the spectral energy content of the second region is determined.

This embodiment of the invention is of particular advantage for specimens with a structure having a strong degree of directional preference, as is the case for example with integrated circuits. At the first setting of the objective lens, two images are made with transversely disposed (preferably mutually perpendicular) astigmatism. The same is done at a second setting of the objective lens. Now, for each of the four images thus made, two different sectors are again chosen in (the two-dimensional graphical depiction of) the spectral energy content (which sectors preferably have mutually-perpendicular oriented central axes) and the difference is determined between the spectral energy contents of each of those two sectors, which difference shall be referred to here as the sector-difference. This difference provides a measure of the magnitude and direction of the anisotropy which exists in the image in question. Both the directional preference of the specimen and the astigmatism in the beam have therefore contributed to this anisotropy.

The aforementioned sector-difference is determined for each of the four images mentioned in this embodiment. In both of the images made at the same setting of the objective lens, the contribution of the structures in the specimen having a strong directional preference is the same in each of the sector-differences; when one therefore determines the difference between these two sector-differences (the final difference), then this contribution will be cancelled. Because of this, the final difference reflects almost exclusively the effect of the astigmatic smearing. This is applicable both to the final difference of the images made at the first setting of the objective lens and to the final difference of the images made at the second setting of the objective lens.

The two final differences thus formed can now be mutually compared, and, on the basis of this comparison, it can be determined if the image made at the first setting of the objective lens either does or does not exhibit a direction of the astigmatic smearing equal to that in the image made at the second setting of the objective lens. Subsequently, the previously-mentioned continuation of the method can be carried out—that is to say, in the case of equality of the directions of the astigmatic smearing, the repeating of steps (k) and (l), and, in the case of inequality of these directions, the performing of an interpolation process between the first setting of the objective lens and the last-obtained setting of the objective lens so as to determine that setting of the objective lens whereby the beam of electrically charged particles attains its optimum focus.

In yet another embodiment of the invention, the performance of the interpolation process between the first setting of the objective lens and the last-obtained setting of the objective lens takes place in that:

(m) the magnitude of the difference between the spectral energy content in the first region and the spectral energy content in the second region in each of the accompanying images is determined (n) by interpolation between these values, an estimate is obtained for the value of that setting of the objective lens whereby the beam of electrically charged particles attains its optimal focus (o) a new image is made at the thus-estimated setting whereupon step (m) is performed, after which the set of values obtained at this new setting serve as new values with which interpolation is again performed (p) the last-mentioned step is repeated until the difference between two subsequent values of the setting of the objective lens is smaller than a pre-stipulated value, after which the last obtained value is held to be the setting of the objective lens whereby the beam of electrically charged particles attains its optimum focus.

By determining the difference between the spectral energy contents of both regions in each of the images, a measure is obtained for the degree to which the setting of the objective lens deviates from the optimum focus for each of those images. It is known that the optimum focus in the neighborhood of an interpolation point will lie between those two aforementioned points; a better approximation to the optimum focus will be obtained by performing a new interpolation with this estimate and this process is continued until the optimum focus is sufficiently approximated.

In a further embodiment of the invention, a different value of the astigmatism is additionally set for the image made attendant to step (o). Because of these measures, the form of the elliptical cross-section of the astigmatic beam (the "ellipticality") can be used to increase the sensitivity of the result of the algorithm. This sensitivity is preferably maximized for as small as possible an effort of the algorithm. The influence of the spectral content of the image can be increased by adapting the ratio of the long and the short axes (the "ellipticality") to the degree to which the algorithm has approximated the optimum focus.

In yet a further embodiment of the invention, the image processing occurs in digital form and a subframe of the image in question is formed in order to determine the spectral energy content of the aforementioned spectral regions. In this manner, a substantial reduction in the calculation burden of the algorithm is effected, whereby faster focusing of the beam can be achieved. The forming of a subframe can occur through the selection of a region in the image with the correct information-content and the performance of the further processing of the method according to the invention with this sub-region.

BRIEF DESCRIPTION OF THE DRAWINGS

The invention will be further elucidated on the basis of the Figures, whereby the related elements are depicted with the same reference numbers. The figures depict as follows.

DETAILED DESCRIPTION OF PREFERRED EMBODIMENTS

Figure 1:
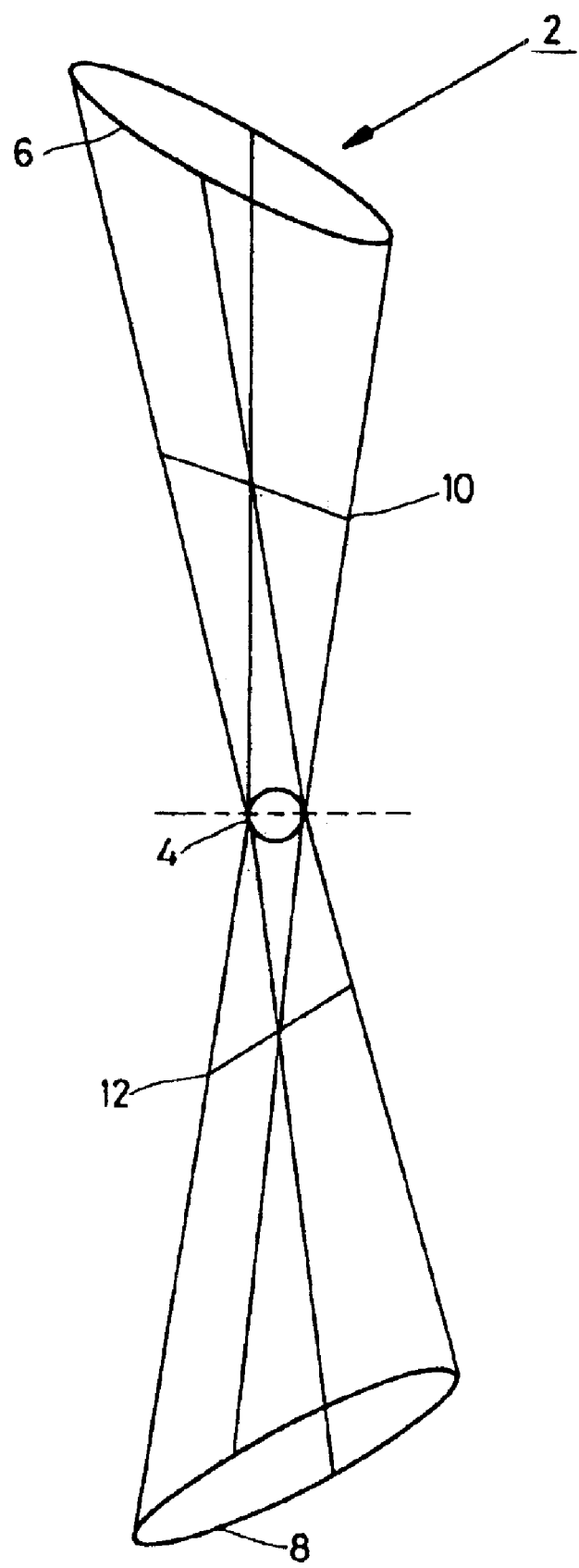
FIG. 1: a schematic representation of an astigmatic electron beam.

FIG. 1 schematically depicts an astigmatic electron beam 2. The direction of the electrons in this beam is from top to bottom. The nominal focus in this beam is situated at the location of the cross-section 4, which cross-section is circular at this location. Above and below the nominal focus the beam has an elliptical cross-section, as is depicted by the ellipses 6 and 8. The long (short) axis of ellipse 6 is thereby perpendicular to the corresponding axis of ellipse 8. Conversely, one can suppose that when the corresponding axes are perpendicular to each other in two elliptically-shaped cross-sections in an electron beam, the nominal focus of this beam must lie between these cross-sections, and that, when the corresponding axes of two such elliptically-shaped cross-sections are mutually parallel, these cross-sections must lie on the same side of the nominal focus. The current invention makes use of this insight. Between the aforementioned elliptical cross-sections 6 and 8, respectively, and the nominal focus 4, there is a place where the cross-section of the beam has the shape of a line 10 and 12, respectively. A specimen in an electron microscope can now be illuminated with the depicted astigmatic beam and images can be made in a manner usual to such a microscope, with the understanding that for the application of the invention, the beam is deliberately made astigmatic at the outset and that the method according to the invention generally begins with illuminating the specimen with an astigmatic cross-section of the electron beam. The result of using such an illumination in the making of an image is that each image-point will be stretched in the direction of the long axis of the ellipse rather than being round (that is to say, point-shaped by approximation), and is therefore stripe-like by approximation, whereby a "smearing" in the image in the direction of the long axis will occur. The degree of smearing can be quantized by subjecting the image to a well-known method for the spectral analysis of the spatial frequencies occurring in the image, such as, for example, the so-called Fast Fourier Transform (FFT). As is known, the FFT provides a representation of the distribution of the spectral energy (the energy spectrum) occurring in the image as a function of the spatial frequency; in the case of a two-dimensional image, that will therefore be as a function of the spatial frequencies in both the x and y directions. A graphical representation of the result of this FFT applied to an electron microscope image is depicted in FIGS. 2a, 2b and 2c.

Figure 2A:
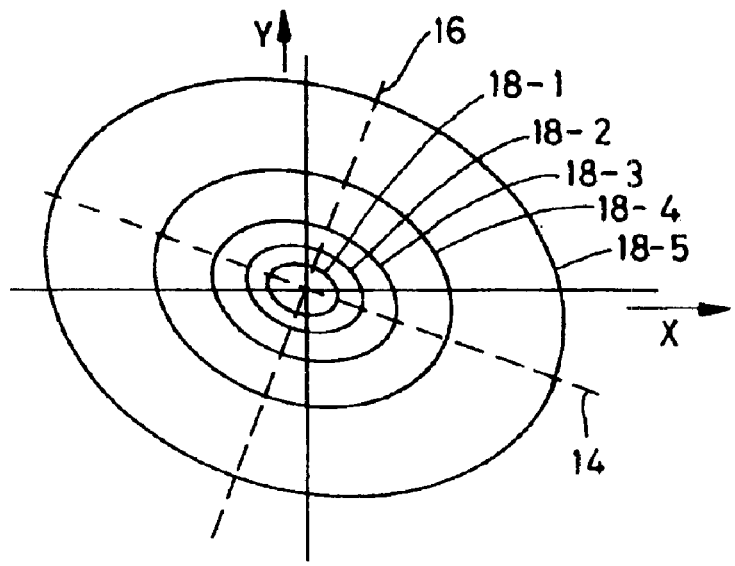
FIG. 2a: a graphical representation of an energy spectrum of a non-isotropic specimen imaged with a non-astigmatic beam.
Figure 2B:
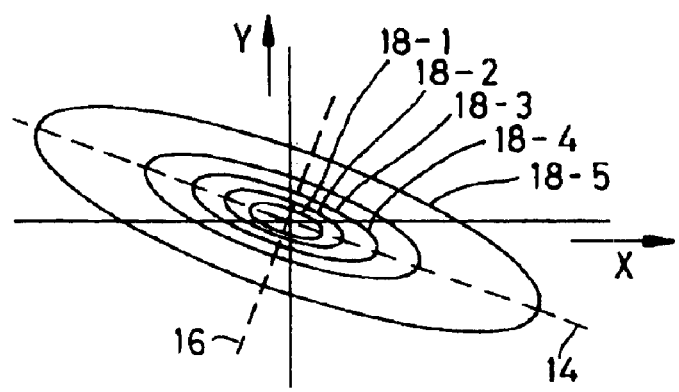
FIG. 2b: a graphical representation of an energy spectrum of the specimen according to FIG. 2a imaged with an astigmatic beam with a first direction of the astigmatism.
Figure 2C:
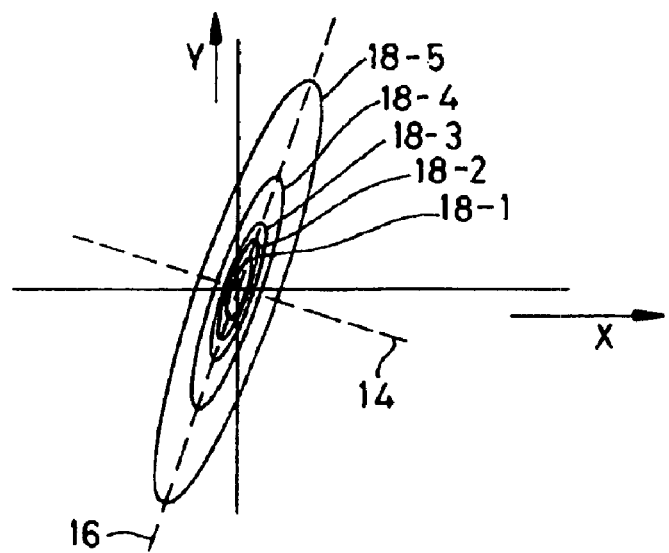
FIG. 2c: a graphical representation of an energy spectrum of the specimen according to FIG. 2a imaged with an astigmatic beam with a direction of the astigmatism perpendicular to that of FIG. 2b.

In FIGS. 2a, 2b and 2c, FIG. 2a shows the graphical representation of an energy spectrum of a non-isotropic specimen imaged with a non-astigmatic beam, FIG. 2b shows the graphical representation of an energy spectrum of the specimen according to FIG. 2a imaged with an astigmatic beam with a first direction of the astigmatism, and FIG. 2c shows the graphical representation of an energy spectrum of the specimen according to FIG. 2a imaged with an astigmatic beam with a direction of the astigmatism perpendicular to that of FIG. 2b. Although it is possible to graphically depict the energy spectrum in the form of a grey-level distribution in the two-dimensional plane, for clarity of depiction in FIG. 2 preference is given to a representation in the form of lines of equal energy-density. In FIGS. 2a–2c, the location of the lines of equal energy density is chosen in such a manner that the middle of the figures (thus the origin of the x-y axis intersection) corresponds to the spatial frequency value zero.

The energy spectrum in FIG. 2a is based on an image with a non-astigmatic beam. One would expect hereby an energy spectrum with circular lines of equal relative energy 18-1 to 18-5—in general 18-i—because such a beam cannot exhibit any smearing in an astigmatic direction. The fact that the depicted lines 18-i nevertheless are not circles is caused by anisotropy in the specimen, that is to say that the specimen itself exhibits spatial frequencies in one direction which differ from those in other directions. In the case of FIG. 2a, the specimen has more high spatial frequencies in the direction of the broken line 14 than in the direction of broken line 16; this can be caused, for example, by the fact that the specimen contains many oblong details whose longitudinal direction lies in the direction of the broken line 16.

In FIG. 2b, the energy spectrum is based on an image of the same specimen as in FIG. 2a but then illuminated with an astigmatic beam. The lines of equal relative energy 18-i hereby exhibit smearing in a direction which is determined by the combination of the anisotropy in the specimen and the astigmatism in the beam. If the depicted specimen had the same direction as in the image according to FIG. 2a then it can be assumed that the direction of the long axis of the elliptical cross-section of the beam with which the specimen was illuminated is the same as that of the longitudinal direction of the oblong details in the specimen.

In FIG. 2c, the energy spectrum is based on an image of the same specimen as in FIGS. 2a and 2b, but then illuminated with an astigmatic beam whose direction of astigmatism is perpendicular to that of FIG. 2b. The lines of equal relative energy 18-i hereby exhibit a smearing in a direction which, just as in FIG. 2b, is determined by the anisotropy in the specimen and the astigmatism in the beam. Because the high frequencies in FIG. 2c now largely occur in the direction of the broken line 14—and therefore transverse to the direction of line 16—it may be assumed that the direction of the long axis of the elliptical cross-section with which the specimen was illuminated was perpendicular to that of the longitudinal direction of the oblong details in the specimen, and that the influence of this ellipticality of the beam was significantly greater than that of the specimen-anisotropy.

Figure 3:
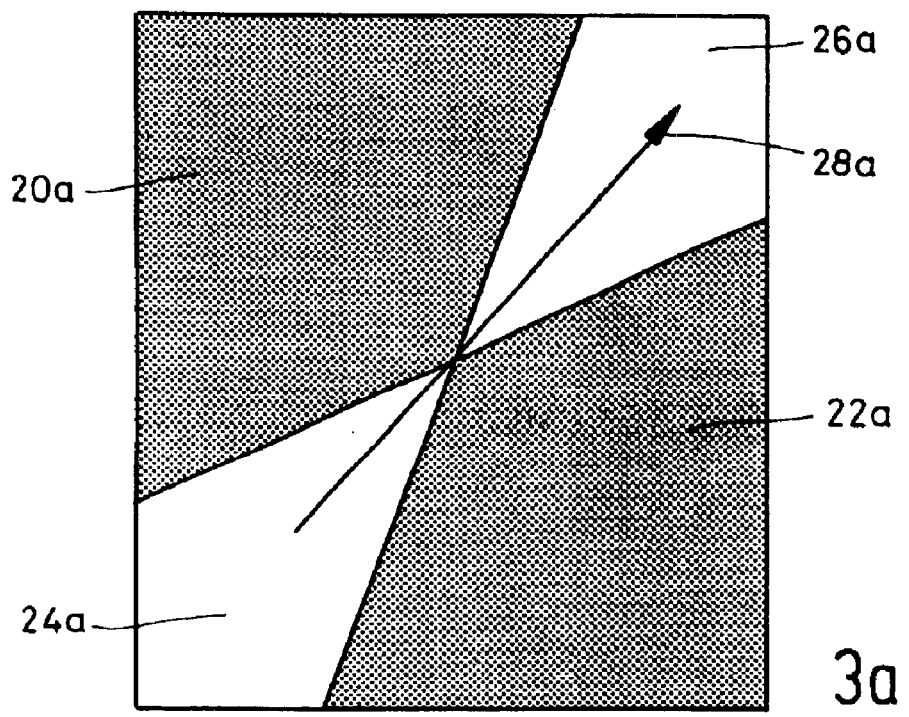
FIGS. 3a and 3b: a depiction of two maskings to be applied in determining the astigmatic smearing in the energy-spectra of the images made with the astigmatic beams.
Figure 3:
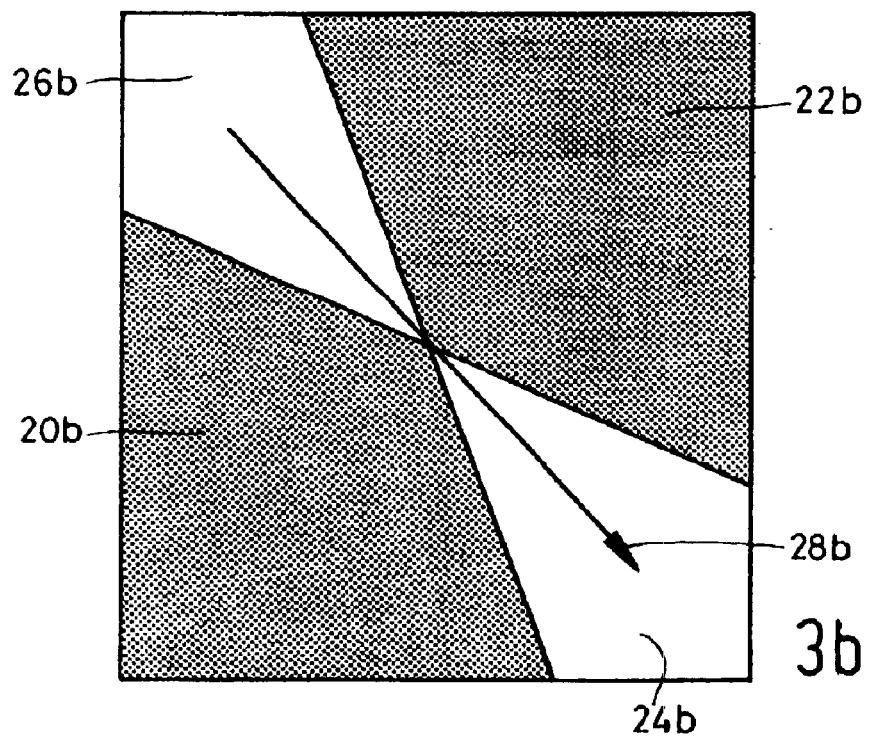

FIG. 3 is a depiction of two maskings that are to be applied to the energy-spectra of the images made with the astigmatic beams in order to determine the astigmatic smearing. As has been previously remarked above, the FFT of an image reflects the distribution of the spectral energy in the image as a function of the spatial frequency; in the case of a two-dimensional image this is therefore as a function of the spatial frequencies in both the x and the y directions. It is assumed, for the description of the masking process, that the aforementioned energy spectra are graphically represented in the form of a grey-level distribution in the two-dimensional plane, and not, as is the case in FIG. 2, in the form of lines of equal relative energy density. With respect to FIG. 3, the position of the grey-level distribution in the two-dimensional plane is chosen in such a manner that the middle of the figure of the grey-level distribution corresponds to the spatial frequency value zero, which middle coincides with the middle of FIG. 3.

The application of these maskings can be imagined in such a manner that the figure of the masking is brought into complete coverage with the energy spectrum of the image whose astigmatic smearing is to be determined. Upon applying these maskings, the region of the energy spectrum depicted as a two-dimensional grey-level distribution that is covered by the rastered regions 20a, 22a, 20b, 22b of the masking does not contribute to the spectral energy content to be determined, whereas the region of the energy spectrum depicted as a two-dimensional grey-level distribution that is covered by the non-rastered regions 24a, 26a, 24b, 26b of the masking contributes in its entirety to the spectral energy content to be determined. Consequently, as a result of the application of the masking according to FIG. 3a, the spectral energy is determined in a direction which, in large, is indicated by arrow 28a, and, as a result of the application of the masking according to FIG. 3b, the spectral energy is consequently determined in a direction which, in large, is indicated by arrow 28b. When an image of a specimen is now made with an astigmatic beam with a given astigmatic direction (that is to say the direction of the long axis of the elliptical beam cross-section at the location of the specimen), then relatively few high spatial frequencies will occur in this astigmatic direction, whereas relatively many will occur in the direction perpendicular thereto. When the astigmatic direction lies in the direction of arrow 28a (FIG. 3a) then, in the energy spectrum of this image masked in accordance with FIG. 3a, a relatively low spectral energy content will be observed, and, in an energy spectrum of this same image masked in accordance with FIG. 3b, a relatively high spectral energy content.

In the most simple embodiment of the method according to the invention, it is assumed that the specimen is entirely isotropic in its own right, that is to say that there is no directional preference for the spatial frequencies present in the specimen. In this situation, two images of the specimen are made. Upon making the first image, the specimen is illuminated with a beam which is obtained with a first power setting of the focusing lens (the objective lens), whereby a certain degree of astigmatism is introduced in the illuminating beam. Subsequently, upon making the second image, a different power setting of the objective lens is chosen and all other settings (in particular the astigmatism) are left unchanged. Thereafter, an energy spectrum of both images is prepared, and each of these energy spectra is subjected to two maskings—one in accordance with FIG. 3a and one in accordance with FIG. 3b. In order to now determine the direction of the astigmatic smearing, a quantity V is defined which gives an indication of the direction in which the highest spatial frequencies in the energy spectrum of an image occur. For the situation as described above, the quantity V has the following form:

$$V = \left( \frac{\sum_{region\ 24a, 26a} P_i - \sum_{region\ 24b, 26b} P_i}{\sum_{total} P_i} \right) \quad (1)$$

In the above expression, the first summation extends over the regions 24a and 26a of FIG. 3a and the second summation extends over the regions 24b and 26b of FIG. 3b; moreover Pi is the spectral power of a frequency region i, and the summation extends over all of the practically important frequencies i in the regions of the maskings indicated in the summation signs above. The summation indicated in the denominator of expression (1) renders the total spectral power in the image in question. The quantity V is now determined for each of the two images. If the astigmatic direction in the first image is equal to the direction of arrow 28a (FIG. 3), then the region 24a, 26a will have a lower spectral energy content than the region 24b, 26b; the sign of V will then have a first value (for example, positive). If the astigmatic direction in the second image were to be the same as that in the first image, then, in that case, the sign of the quantity V will be the same as it was with the first image. It is then known that, attendant to the change of the power setting of the objective lens, the optimum focus of the beam has not passed the specimen. In that case, a further image must be made, which must be done repeatedly until the sign of V reverses. It is then known that the astigmatic directions of the two most recently-made images were perpendicular to each other and that the optimum focus must lie between the last two settings of the objective lens. Via an interpolation process yet to be described, one now determines the value of the power setting of the objective lens whereby the optimum focus lies on the specimen. Thereupon, the desired focusing of the electron beam has been reached.

In another embodiment of the method according to the invention, it is assumed that the specimen is not isotropic, that is to say that there is a directional preference for the spatial frequencies in the specimen. In this case, four images of the specimen are made. One makes a first image at a first power setting of the objective lens whereby a certain degree of astigmatism is introduced into the illuminating beam so that this first imaging takes place with a first astigmatic beam. Subsequently, with the same power setting of the objective lens, a first further image (thus the second image of the four in total) is made, whereby a different astigmatism is introduced into the illuminating beam in such a manner that a first further astigmatic beam arises with a known astigmatic direction which is transverse to the astigmatic direction of the first astigmatic beam. After making these two images a further two images are made, namely another image is made at a second power setting of the objective lens (thus the third image of the four in total) whereby a certain degree of astigmatism is introduced into the illuminating beam so that this last-mentioned imaging takes place with a second astigmatic beam. Subsequently, with the same power setting of the objective lens, a second further image (thus the fourth image of the four in total) is made whereby a different astigmatism is introduced into the illuminating beam in such a manner that a second further astigmatic beam arises with a known astigmatic direction which is transverse to the astigmatic direction that was present in the beam while making the third image. An energy spectrum is now made for each of the four images and each of these four energy spectra is now twice masked, once with the masking in accordance with FIG. 3a and once with the masking in accordance with FIG. 3b. This means that for each of the four images the total spectral energy content is determined for a region that is formed from regions 24a and 26a together and for a region that is formed from regions 24b and 26b together. For the case under discussion here, whereby the specimen to be imaged is non-isotropic, a quantity V can now again be defined which provides an indication of the direction in which the highest spatial frequencies in the energy spectrum of an image occur. For the situation described hereabove this quantity V has the following form:

$$V = \left( \frac{\sum_{region\,24a,26a} P_i - \sum_{region\,24b,26b} P_i}{\sum_{total} P_i} \right)_{image\,1} - \quad (2)$$

$$\left( \frac{\sum_{region\,24a,26a} P_i - \sum_{region\,24a,26b} P_i}{\sum_{total} P_i} \right)_{image\,2}$$

This expression (2) is applied once to both of the images made at the first power setting of the objective lens, and is subsequently also applied once to both of the images made at the second power setting of the objective lens. In expression (2), the leftmost term annotated with the index "image 1" relates to the image made with the first astigmatic beam (thus the first image of the four in total), and the rightmost term annotated with the index "image 2" relates to the image made with the first further astigmatic beam (thus the second image of the four in total). The first summation in the numerator of the leftmost term is now obtained by masking the first image with the mask in accordance with FIG. 3a, and the second summation in the numerator of the leftmost term is obtained by masking the first image with the mask in accordance with FIG. 3b. The sum in the denominator of the leftmost term represents the total spectral energy in the first image. In this manner, the leftmost term of expression (2) reflects the degree of astigmatic smearing, which astigmatic smearing consists of two components—namely a contribution which stems from the anisotropy of the specimen and a contribution which stems from the astigmatism introduced into the electron beam. The rightmost term of expression (2) is analogously constructed, whereby the contribution attributable to the anisotropy of the specimen is of course equal to that in the leftmost term. Because in accordance with expression (2) the difference between these two terms is taken, this contribution in expression (2) is cancelled. The value of the quantity V is thus obtained from the two images made at one power setting of the objective, and, in the manner described above, the sign of this quantity represents solely the direction of the smearing in the image which results from the astigmatism in the electron beam.

The method described above as applied to the images made at the first power setting of the objective lens can be likewise applied to the images made at the second power setting of the objective lens. The sign of the thus-determined quantity V then also solely represents the direction of the smearing in the image which results from the astigmatism in the electron beam. If, upon the transition from the first to the second power setting of the objective lens, the optimum focus of the beam comes to lie on the other side of the specimen (thus implying a transition from under-focus to over-focus or vice versa), then this will be apparent from the reversal of the sign of the quantity V. Conversely, if the sign of V does not change then it can be concluded that the condition of optimum focus has not been passed. In that case, it is necessary to make further pairs of images in a process which is to be repeated until the sign of V changes in value, whereupon, via the aforementioned process of interpolation, the optimum value of the power setting of the objective lens is determined.

Figure 4:
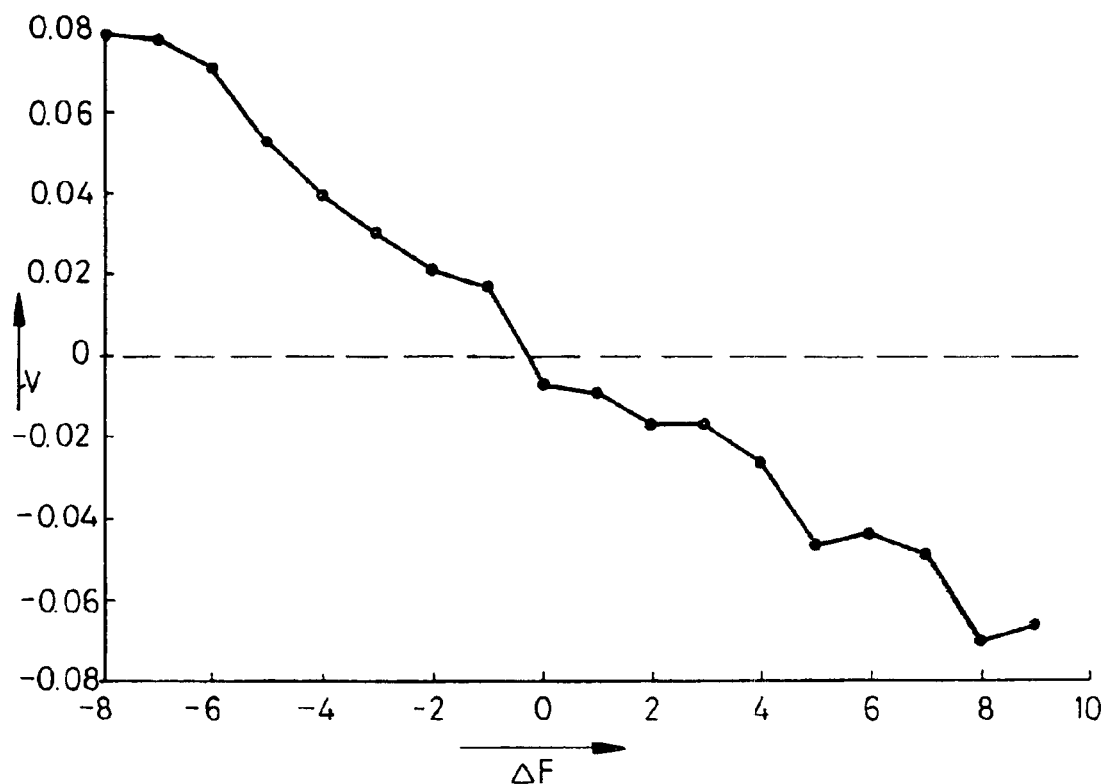
FIG. 4: a graphical representation of the course of a quantity that shows the difference in spectral energy content between two images—made at differing attendant astigmatism—as a function of the power of the lens focusing the beam.

As an illustration of the correspondence between the quantity V according to expression (1) or (2) and the power setting of the objective lens, a graphical depiction is provided in FIG. 4 of a measured course of the quantity V (in arbitrary units) as a function of the power setting of the objective lens ΔF (in arbitrary units). This course is recorded in close proximity to the zero-crossing of the curve; that is to say in the neighborhood of the optimum focus. Each measuring point in the graph is obtained in the manner described above, whereby, for each setting of the power of the objective lens, the quantity V is calculated according to expression (1) or (2). It can now be seen in FIG. 4 that the quantity V transitions from a positive value to a negative value, whereby the quantity V thus passes through zero; it is at this zero-crossing that the setting for the optimum focus of the objective lens lies. In order to find this point in a practical situation an iterative process as further described hereunder is applied.

Figure 5:
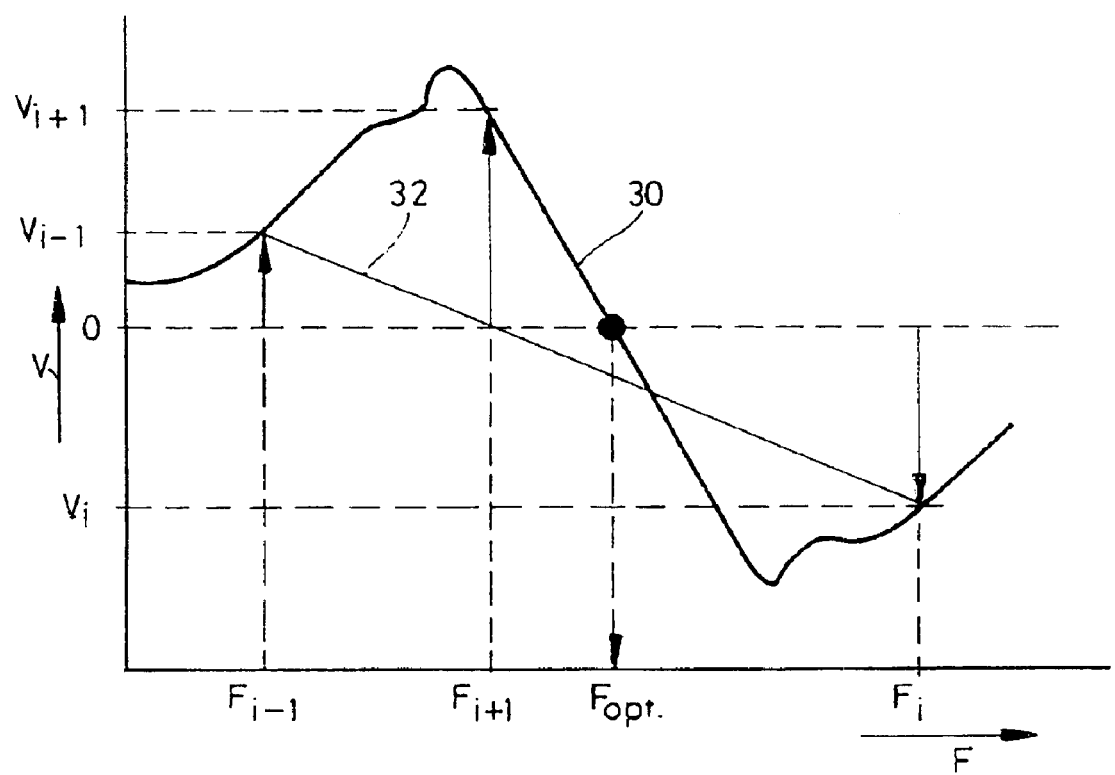
FIG. 5: a graphical representation provided as a means of illustrating the course of the iteration algorithm for the determination of the setting of the lens focusing the beam at optimal focus.

The goal of the iteration algorithm is to find successive working distances (power settings of the objective lens) which bring the optimum focus closer and closer to the specimen. The iteration algorithm to be described here is based on linear interpolation. This algorithm is explained with the aid of FIG. 5, wherein curve 30 shows the course of quantity V as a function of the distance F of the specimen to the optimum focus Fopt (the "focus distance"). Contrary to FIG. 4, FIG. 5 records the course of curve 30 in a broader vicinity of the zero-crossing of the curve; that is to say that the beginning and end points of curve 30 are situated at a relatively large distance from the optimum focus. The algorithm commences with the assumption of an initial power setting of the objective lens whereby the focus distance is represented by Fi−1. Depending on the sign of the quantity V as determined at the first power setting (Vi−1), an estimate is made for a new focus distance Fi in such a manner that the new focus distance Fi brings the optimum focus closer to the specimen than the previous focus distance Fi−1. If, at this new focus distance Fi, the sign of the thereto attendant quantity Vi is the same as the sign of the previous value Vi−1 then the same procedure is repeated until the sign of V reverses polarity. Subsequently, a linear interpolation is performed between the two measuring points (Fi−1, Vi−1) and (Fi, Vi), as depicted by the straight line 32 between these two measuring points. The value of the focus distance whereby line 32 cuts the horizontal axis is Fi+1; at this value of the focus distance the attendant value of the quantity V is determined (Vi+1). Depending on the sign of Vi+1 a previous measuring point is now selected with which the interpolation is continued; if it appears that the immediately-previous value of V (thus Vi) is opposite in polarity to Vi+1 then the interpolation is continued with the measuring point pair (Fi, Vi) and (Fi+1, Vi+1) and otherwise with the measuring point pair (Fi−1, Vi−1) and (Fi, Vi). This process of iteration is subsequently repeated until the difference between two successive de-focusing values drops under a pre-stipulated value. The focus distance attendant thereto is taken to be the optimum focus.

It is to be noted that the calculation time required by this algorithm can be considerably shortened by using a subframe of the dataset of an image rather than using the entire dataset. The calculation burden upon the algorithm can be reduced considerably thereby, whereby a faster focusing of the beam can be achieved. The formation of the subframe can take place by selecting a region in the image with a high information-content; that is to say a region within which a lot of detail in the image can be resolved, which means that a high spectral energy content is present therein. The further manipulations of the method according to the invention can now be carried out with this sub-region.

We claim as follows:

1. A method for focusing a beam of electrically-charged particles in a particle-optical device with an imaging objective lens, comprising the steps:

(a). forming from the aforementioned beam (that is to say the beam of electrically charged particles that is to be focused in the particle-optical device), a first astigmatic beam with an attendant astigmatic direction for a first setting of the objective lens;

(b). making an image, with the first astigmatic beam, of a specimen in the particle-optical device;

(c). determining the direction of the astigmatic smearing (blurring) in the image made in step (b);

(d). providing a different setting to the objective lens;

(e). forming a second astigmatic beam from the aforementioned beam, which second beam has an attendant astigmatic direction for the other setting of the objective lens;

(f). making an image of the specimen with the second astigmatic beam;

(g). determining the direction of the astigmatic smearing in the image made in step (f);

(h). comparing the direction of the astigmatic smearing in the image made in step (b) with that of the image made in step (f);

(i). repeating steps (d) to (h) in the case that the aforementioned directions are equal, and, in the case that the aforementioned directions are not equal, performing an interpolation process between the first setting of the objective lens and the last-obtained setting of the objective lens so as to determine that setting of the objective lens at which the beam of electrically charged particles attains its optimum focus.

2. A method according to claim 1, wherein the determination of the direction of the astigmatic smearing in an image takes place by determining the spectral energy content of a first spectral region of the image in question with a first direction, and of the spectral energy content of a second spectral region of that image with a second direction transverse to the first direction, and by determining at least the sign of the difference between the spectral energy content in the first region and the spectral energy content in the second region.

3. A method according to claim 2, wherein the comparison of the direction of the astigmatic smearing in the image made in step (b) with that of the image made in step (f) takes place by comparing the signs of the difference in the spectral energy content of the first region and of the spectral energy content of the second region of each of the images.

4. A method according to claim 3, wherein the image processing occurs in digital form, and wherein a subframe of the image in question is formed in order to determine the spectral energy content of the aforementioned spectral regions.

5. A method according to claim 3, wherein the performance of the interpolation process between the first setting of the objective lens and the last-obtained setting of the objective lens takes place in that:

(m) the magnitude of the difference between the spectral energy content in the first region and the spectral energy content in the second region in each of the accompanying images is determined (n) by interpolation between these values, an estimate is obtained for the value of that setting of the objective lens whereby the beam of electrically charged particles attains its optimal focus (o) a new image is made at the thus-estimated setting whereupon step (m) is performed, after which the set of values obtained at this new setting serve as new values with which interpolation is again performed (p) the last-mentioned step is repeated until the difference between two subsequent values of the setting of the objective lens is smaller than a pre-stipulated value, after which the last obtained value is held to be the setting of the objective lens whereby the beam of electrically charged particles attains its optimum focus.

6. A method according to claim 5 wherein a different value of the astigmatism is additionally set for the image made attendant to step (o).

7. A method according to claim 6, wherein the image processing occurs in digital form, and wherein a subframe of the image in question is formed in order to determine the spectral energy content of the aforementioned spectral regions.

8. A method according to claim 5, wherein the image processing occurs in digital form, and wherein a subframe of the image in question is formed in order to determine the spectral energy content of the aforementioned spectral regions.

9. A method according claim 2, wherein the performance of the interpolation process between the first setting of the objective lens and the last-obtained setting of the objective lens takes place in that:

(m) the magnitude of the difference between the spectral energy content in the first region and the spectral energy content in the second region in each of the accompanying images is determined (n) by interpolation between these values, an estimate is obtained for the value of that setting of the objective lens whereby the beam of electrically charged particles attains its optimal focus (o) a new image is made at the thus-estimated setting whereupon step (m) is performed, after which the set of values obtained at this new setting serve as new values with which interpolation is again performed (p) the last-mentioned step is repeated until the difference between two subsequent values of the setting of the objective lens is smaller than a pre-stipulated value, after which the last obtained value is held to be the setting of the objective lens whereby the beam of electrically charged particles attains its optimum focus.

10. A method according to claim 9 wherein a different value of the astigmatism is additionally set for the image made attendant to step (o).

11. A method according to claim 10, wherein the image processing occurs in digital form, and wherein a subframe of the image in question is formed in order to determine the spectral energy content of the aforementioned spectral regions.

12. A method according to claim 9, wherein the image processing occurs in digital form, and wherein a subframe of the image in question is formed in order to determine the spectral energy content of the aforementioned spectral regions.

13. A method according to claim 2, wherein the image processing occurs in digital form, and wherein a subframe of the image in question is formed in order to determine the spectral energy content of the aforementioned spectral regions.

14. A method according to claim 1, wherein (j) for the first setting of the objective lens, a first further astigmatic beam with a known astigmatic direction transverse to the astigmatic direction of the first astigmatic beam is formed, and a first image of the specimen is made with the first astigmatic beam and a first further image of the specimen is made with the first further astigmatic beam;

(k) for the second setting of the objective lens, a second further astigmatic beam with a known astigmatic direction transverse to the astigmatic direction of the second astigmatic beam is formed, and a second image of the specimen is made with the second astigmatic beam and a second further image of the specimen is made with the second further astigmatic beam;

(l) in the four images thus made, the direction of the astigmatic smearing is determined by determining the spectral energy content of a first spectral region of the image in question with a first direction, and determining the spectral energy content of a second spectral region of that image with a second direction transverse to the first direction, whereby, in each image, at least the sign of the difference between the spectral energy content of the first region and the spectral energy content of the second region is determined.

15. A method according to claim 14, wherein the performance of the interpolation process between the first setting of the objective lens and the last-obtained setting of the objective lens takes place in that:

(m) the magnitude of the difference between the spectral energy content in the first region and the spectral energy content in the second region in each of the accompanying images is determined (n) by interpolation between these values, an estimate is obtained for the value of that setting of the objective lens whereby the beam of electrically charged particles attains its optimal focus (o) a new image is made at the thus-estimated setting whereupon step (m) is performed, after which the set of values obtained at this new setting serve as new values with which interpolation is again performed (p) the last-mentioned step is repeated until the difference between two subsequent values of the setting of the objective lens is smaller than a pre-stipulated value, after which the last obtained value is held to be the setting of the objective lens whereby the beam of electrically charged particles attains its optimum focus.

16. A method according to claim 15, wherein the image processing occurs in digital form, and wherein a subframe of the image in question is formed in order to determine the spectral energy content of the aforementioned spectral regions.

17. A method according to claim 15 wherein a different value of the astigmatism is additionally set for the image made attendant to step (o).

18. A method according to claim 17, wherein the image processing occurs in digital form, and wherein a subframe of the image in question is formed in order to determine the spectral energy content of the aforementioned spectral regions.

19. A method according to claim 14, wherein the image processing occurs in digital form, and wherein a subframe of the image in question is formed in order to determine the spectral energy content of the aforementioned spectral regions.

* * * * *